US009123661B2

(12) United States Patent
Kellogg

(10) Patent No.: US 9,123,661 B2
(45) Date of Patent: Sep. 1, 2015

(54) SILICON CONTAINING CONFINEMENT RING FOR PLASMA PROCESSING APPARATUS AND METHOD OF FORMING THEREOF

(71) Applicant: Lam Research Corporation, Fremont, CA (US)

(72) Inventor: Michael C. Kellogg, Oakland, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 57 days.

(21) Appl. No.: 13/961,277

(22) Filed: Aug. 7, 2013

(65) Prior Publication Data

US 2015/0044873 A1    Feb. 12, 2015

(51) Int. Cl.
| | |
|---|---|
| *H01L 21/311* | (2006.01) |
| *H01J 9/00* | (2006.01) |
| *B29C 33/38* | (2006.01) |
| *H01L 21/3205* | (2006.01) |
| *B29K 83/00* | (2006.01) |

(52) U.S. Cl.
CPC .......... *H01L 21/31116* (2013.01); *B29C 33/38* (2013.01); *B29C 33/3842* (2013.01); *H01J 9/00* (2013.01); *H01L 21/3205* (2013.01); *B29K 2083/00* (2013.01)

(58) Field of Classification Search
CPC ...................... H01J 37/32091; H01J 37/32642; H01J 37/32623
USPC .......................................................... 216/67
See application file for complete search history.

(56) References Cited

U.S. PATENT DOCUMENTS

| | | |
|---|---|---|
| 5,628,938 A | 5/1997 | Sangeeta et al. |
| 5,904,778 A | 5/1999 | Lu et al. |

(Continued)

FOREIGN PATENT DOCUMENTS

| | | |
|---|---|---|
| EP | 1114807 B1 | 7/2005 |
| JP | 2001-089270 | 4/2001 |

(Continued)

*Primary Examiner* — Nadine Norton
*Assistant Examiner* — Mahmoud Dahimene
(74) *Attorney, Agent, or Firm* — Buchanan, Ingersoll & Rooney PC

(57) ABSTRACT

A method of forming a silicon containing confinement ring for a plasma processing apparatus useful for processing a semiconductor substrate comprises inserting silicon containing vanes into grooves formed in a grooved surface of an annular carbon template wherein the grooved surface of the annular carbon template includes an upwardly projecting step at an inner perimeter thereof wherein each groove extends from the inner perimeter to an outer perimeter of the grooved surface. The step of the grooved surface and a projection at an end of each silicon containing vane is surrounded with an annular carbon member wherein the annular carbon member covers an upper surface of each silicon containing vane in each respective groove. Silicon containing material is deposited on the annular carbon template, the annular carbon member, and exposed portions of each silicon containing vane thereby forming a silicon containing shell of a predetermined thickness. A portion of the silicon containing shell is removed and the annular carbon template and the annular carbon member are removed from the silicon containing shell leaving a silicon containing confinement ring wherein the silicon containing vanes are supported by the silicon containing shell of the silicon containing confinement ring.

14 Claims, 10 Drawing Sheets

(56) References Cited

U.S. PATENT DOCUMENTS

Figure 1:
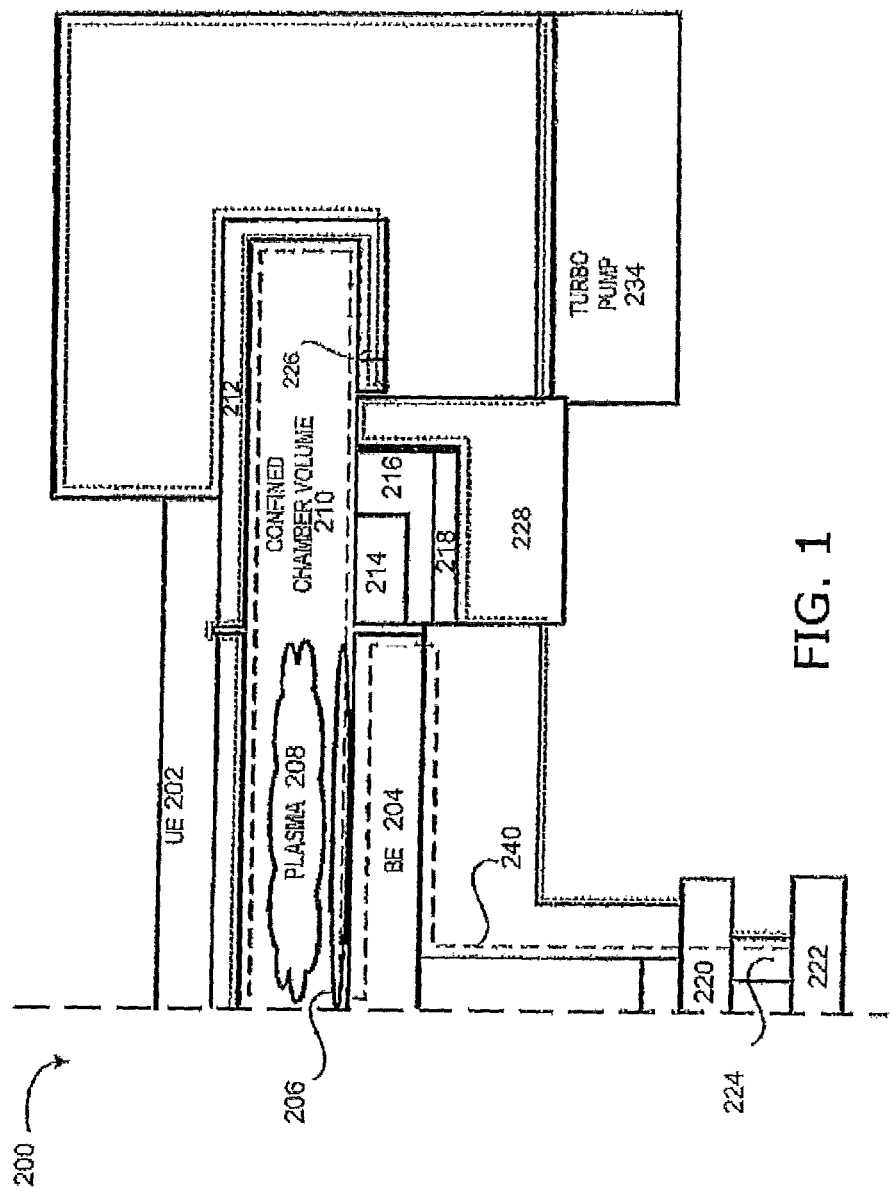

| | | |
|---|---|---|
| 5,925,060 A | 7/1999 | Forber |
| 6,090,304 A | 7/2000 | Zhu et al. |
| 6,120,640 A | 9/2000 | Shih et al. |
| 6,190,495 B1 | 2/2001 | Kubota et al. |
| 6,227,140 B1 | 5/2001 | Kennedy et al. |
| 7,802,539 B2 | 9/2010 | Bosch |
| 8,025,731 B2 | 9/2011 | Ni et al. |
| 2002/0170487 A1 | 11/2002 | Zehavi et al. |
| 2003/0198749 A1 | 10/2003 | Kumar et al. |
| 2004/0206309 A1* | 10/2004 | Bera et al. ............... 118/728 |
| 2004/0229395 A1 | 11/2004 | Goela et al. |
| 2007/0113787 A1 | 5/2007 | Higashiura et al. |
| 2012/0000608 A1* | 1/2012 | Kellogg et al. .......... 156/345.43 |
| 2012/0003836 A1 | 1/2012 | Kellogg et al. |

FOREIGN PATENT DOCUMENTS

| | | |
|---|---|---|
| WO | WO 01/07377 A1 | 2/2001 |
| WO | WO 01/13404 A1 | 2/2001 |

* cited by examiner

SILICON CONTAINING CONFINEMENT RING FOR PLASMA PROCESSING APPARATUS AND METHOD OF FORMING THEREOF

FIELD OF THE INVENTION

The present invention relates to plasma processing apparatuses, and more specifically to a silicon containing confinement ring for a plasma processing apparatus.

BACKGROUND

Integrated circuits are formed from a substrate or semiconductor substrate over which are formed patterned microelectronics layers. In the processing of the substrate, plasma is often employed to deposit films on the substrate or to etch intended portions of the films. Shrinking feature sizes and implementation of new materials in next generation microelectronics layers have put new requirements on plasma processing equipment. The smaller features, larger substrate size and new processing techniques require improvement in plasma processing apparatuses to control the conditions of the plasma processing. Further, the flow of RF current in the plasma processing apparatuses can affect the processing.

SUMMARY

Disclosed herein is a method of forming a silicon containing confinement ring for a plasma processing apparatus useful for processing a semiconductor substrate. The method comprises inserting silicon containing vanes into grooves formed in a grooved surface of an annular carbon template wherein the grooved surface of the annular carbon template includes an upwardly projecting step at an inner perimeter thereof wherein each groove extends from the inner perimeter to an outer perimeter of the grooved surface. The step of the grooved surface is surrounded with an annular carbon member wherein the annular carbon member covers an upper surface of each silicon containing vane in each respective groove. Silicon containing material is deposited on the annular carbon template, the annular carbon member, and exposed portions of each silicon containing vane thereby forming a silicon containing shell of a predetermined thickness. A portion of the silicon containing shell is removed and the annular carbon template and the annular carbon member are removed from the silicon containing shell leaving a silicon containing confinement ring wherein the silicon containing vanes are supported by the silicon containing shell of the silicon containing confinement ring.

Also disclosed herein is a silicon containing confinement ring for a plasma processing apparatus which comprises an upper annular wall which extends horizontally, a sidewall extending vertically downward from an outer end of the upper wall, and a lower annular wall extending horizontally inward from a lower end of the sidewall. The lower annular wall includes circumferentially spaced apart radially extending slots, each of the slots having a length of at least 1.0 inch and a width of about 0.01 to 0.2 inch, the slots being evenly spaced at radial positions offset by no more than 2°.

Also disclosed herein is a method of processing a semiconductor substrate in a plasma processing apparatus including the silicon containing confinement ring. The method comprises transporting a semiconductor substrate into the plasma processing apparatus and supporting the substrate on a substrate support. Introducing a process gas into a confined chamber volume of the plasma processing apparatus wherein the confined chamber volume is defined by at least the silicon containing confinement ring, a lower electrode, and an upper electrode. The process gas is energized into a plasma state, and the semiconductor substrate is processed with the plasma and the process gases and byproducts of the processing are withdrawn through the slots and out of the chamber.

BRIEF DESCRIPTION OF THE DRAWING FIGURES

FIG. 1 shows a block diagram of a capacitively coupled plasma processing chamber.

Figure 2A:
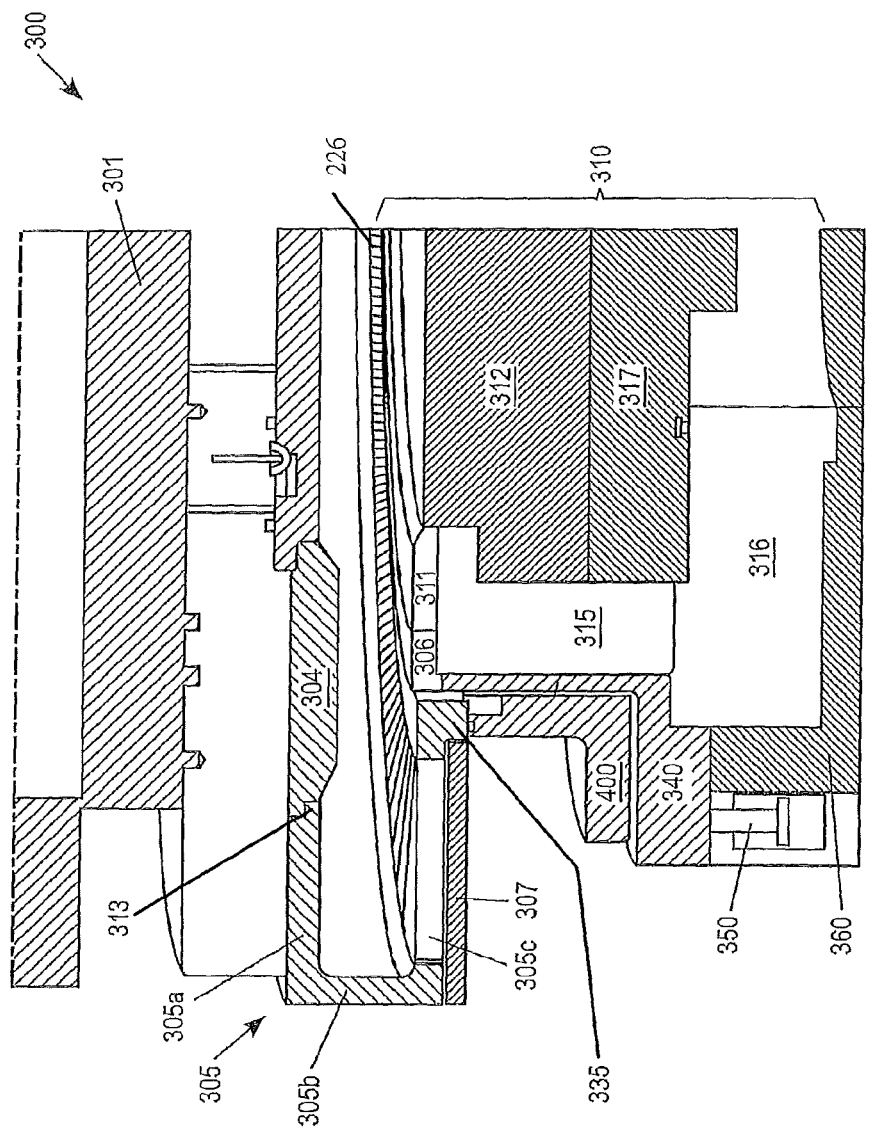
Figure 2B:
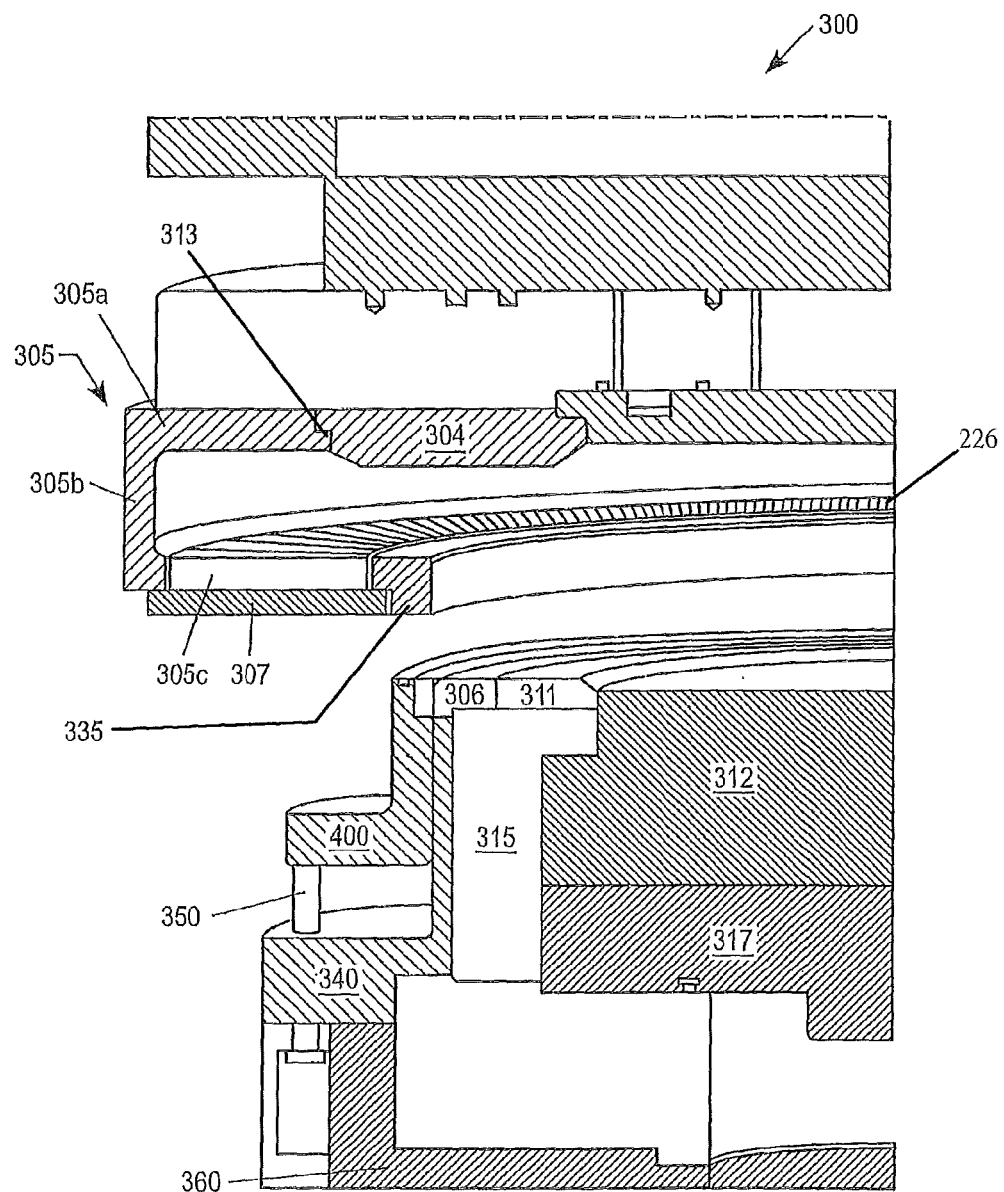

FIGS. 2A, 2B each show a partial cross section of an adjustable gap capacitively coupled plasma processing chamber.

FIGS. 3A-3M illustrate details of an silicon containing confinement ring formed according to methods disclosed herein.

DETAILED DESCRIPTION

In the following description, numerous specific details are set forth in order to provide a thorough understanding of embodiments described herein. However, it will be apparent to one skilled in the art that the embodiments described may be practiced without some of these specific details. In other instances, implementation details and process operations have not been described in detail, if already well known. Additionally, as used herein, the term "about" when used with reference to numerical values refers to ±10%.

Disclosed herein are methods of forming an silicon containing confinement ring which confines plasma in an extended plasma confinement zone surrounding a gap between an upper electrode and a lower electrode of an adjustable gap capacitively coupled plasma processing chamber. In alternate embodiments, the silicon containing confinement ring can be included in an inductively coupled plasma processing chamber to confine plasma in an extended plasma confinement zone surrounding a gap between an upper dielectric window and a lower electrode of the chamber. Details of an exemplary inductively coupled plasma processing chamber can be found in commonly-assigned U.S. Pat. No. 8,025,731 which is incorporated by reference herein in its entirety. The silicon containing confinement ring is preferably formed from silicon or silicon carbide. The methods disclosed herein can form a monolithic silicon containing confinement ring with a near net shape thereby saving materials and costs necessary to machine silicon containing materials such as silicon or silicon carbide. The silicon containing confinement ring includes slots in a lower surface thereof wherein methods disclosed herein can form the slots in the lower surface without machining, thereby reducing the thickness of portions of the lower surface which define the slots, and allowing greater gas flow therethrough.

By way of example, plasma can be produced in a parallel plate processing chamber (i.e. a capacitively coupled plasma processing chamber) such as the dual frequency plasma etching chamber described in commonly-assigned U.S. Pat. No. 6,090,304, the disclosure of which is hereby incorporated by reference. A preferred capacitively coupled plasma processing chamber is a dual frequency capacitively coupled plasma processing chamber including an upper showerhead electrode and a substrate support assembly. For purposes of illustration, embodiments herein are described with reference to a capacitively coupled plasma processing chamber however embodiments described herein may be used in accordance with inductively coupled, helicon, and electron cyclotron resonance plasma processing chambers.

FIG. 1 shows a block diagram of a capacitively coupled plasma processing chamber 200 which illustrates a flow path of RF current therein wherein a substrate 206 can be processed within processing chamber 200. To ignite the plasma for etching substrate 206, a process gas in the chamber 200 is subjected to RF power. The RF current may flow from an RF supply 222 along a cable 224 through an RF match network 220 into processing chamber 200 during substrate processing. The RF current may travel along a path 240 to couple with the process gas to create plasma within a confined chamber volume 210 for processing substrate 206, which is positioned above a bottom electrode 204.

In order to control plasma formation and to protect the processing chamber walls, a confinement ring 212 may be employed. Details of an exemplary confinement ring are described in commonly-assigned U.S. Patent Application No. 2012/0000608, the disclosure of which is hereby incorporated by reference. The confinement ring 212 preferably surrounds the periphery of confined chamber volume 210 in which a plasma is generated. In addition to the confinement ring 212, the periphery of confined chamber volume 210 may also be defined by upper electrode 202 (e.g. showerhead), bottom electrode 204 (e.g. a substrate support including an electrostatic chuck), one or more insulator rings such as 216 and 218, an edge ring 214 and a lower electrode support structure 228.

In order to exhaust neutral gas species from the confinement region (confined chamber volume 210), the confinement ring 212 may include a plurality of slots, such as slots 226 wherein process gas (i.e. neutral gas species) may be pumped out of processing chamber 200, through the slots, via a turbo pump 234.

Figure 3A:
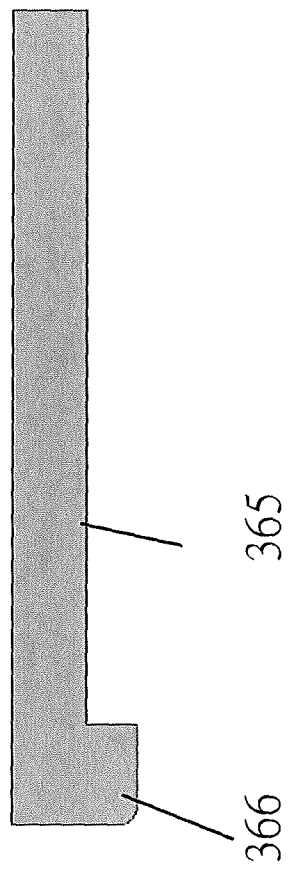
Figure 3B:
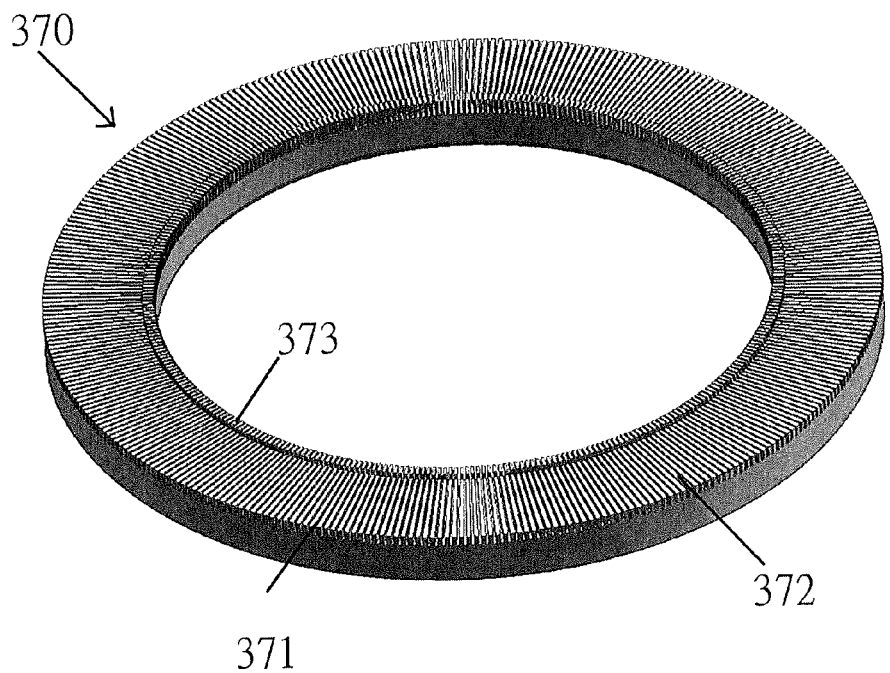

FIGS. 2A and 2B show a partial cross section of an exemplary adjustable gap capacitively-coupled plasma processing chamber 300. The chamber 300 can comprise a movable substrate support assembly 310, an upper electrode including a center electrode plate 303 and an annular outer electrode 304, and an electrically conductive silicon containing confinement ring 305 extending outwardly from the annular outer electrode 304. The silicon containing confinement ring 305 includes an upper annular wall 305a, a sidewall 305b extending downwardly from an outer end of the upper annular wall 305a and a lower annular wall 305c extending inwardly from a lower end of the sidewall 305b, the lower annular wall 305c including radially extending slots 226 through which process gas and reaction byproducts are pumped out of the plasma processing chamber 300. A lower surface of an inner end of the lower annular wall 305c provides electrical contact with an upper end of a movable ground ring 400 when the movable substrate support assembly 310 is in an upper position as shown in FIG. 3A. The lower surface of an inner end of the lower annular wall 305c preferably includes an electrically conductive coating adapted to enhance electrical contact with the movable ground ring 400. Plasma processing of a semiconductor substrate supported on the movable substrate support assembly 310 is carried out when the movable substrate support assembly 310 is at the upper position. The silicon containing confinement ring 305 can include at least one slotted ring 307 below the lower annular wall 305c, the slotted ring 307 being rotatable and vertically movable with respect to the lower annular wall 305c to adjust gas flow conductance through the radially extending slots. FIG. 3B shows a lower position of the movable substrate support assembly 310 at which a semiconductor substrate can be transferred onto the movable substrate support assembly 310.

The movable substrate support assembly 310 can comprise the movable ground ring 400, a lower electrode 317, an electrostatic chuck (ESC) 312 on which a semiconductor substrate is electrostatically clamped, an edge ring 311 having a plasma exposed surface surrounding the ESC 312, a dielectric ring 306 having a plasma exposed surface surrounding the edge ring 311, at least one insulator ring 315 beneath the edge ring 311, a fixed ground ring 340 of electrically conductive material beneath the dielectric ring 306 and surrounding the insulator ring 315. In an embodiment, the movable ground ring 400 can be supported on depressible plungers 350 supported on the fixed ground ring 340. The movable ground ring 400 is movable vertically with respect to the fixed ground ring 340 so as to make electrical contact with the silicon containing confinement ring 305 when the movable substrate support assembly 310 is moved to the upper position. The movable substrate support assembly 310 can be supported on an electrically grounded bias housing 360.

Figure 3C:
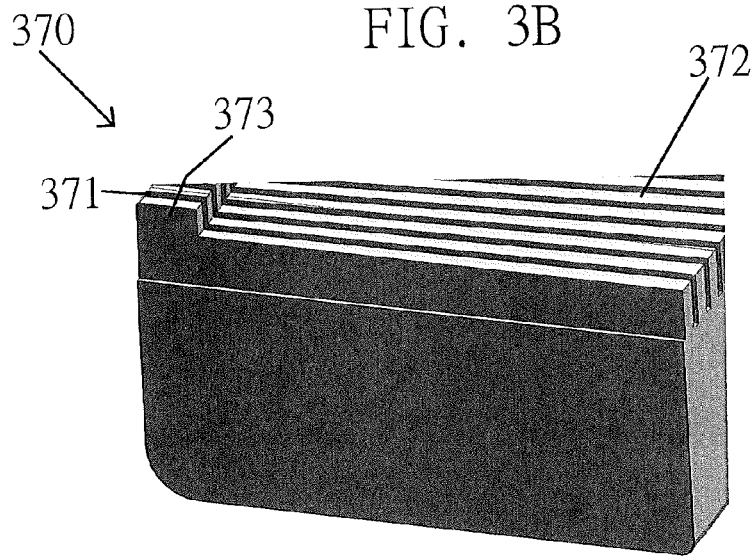

In an embodiment the silicon containing confinement ring 305 can include an annular flange 313 at an inner end of the upper annular wall 305a adapted to underlie an outer edge of the annular outer electrode 304 of the plasma processing chamber 300 useful for processing substrates such as 300 mm or 450 mm wafers. As illustrated in FIGS. 3L and 3M, the lower annular wall 305c includes a downwardly extending annular projection 335 at an inner perimeter thereof. The lower annular wall 305c also includes circumferentially spaced apart radially extending slots 226, each of the slots preferably having a length of at least 1.0 inch, and a width of about 0.01 to 0.2 inch, such as about 0.02 inch. Preferably the width is substantially uniform. The slots are preferably evenly spaced at radial positions offset by about 2° or less, preferably 1.25° or less.

The upper annular wall 305a preferably includes bosses 338 which are preferably internally threaded. Preferably the upper annular wall 305a includes 8 internally threaded bosses. The sidewall 305b preferably is free of openings except for a group of evenly spaced through holes (not shown) arranged close together in 5 horizontal rows to monitor vacuum pressure in the chamber with manometer equipment. Each hole preferably has a diameter of about 0.030 inch and the holes are spaced about 0.06 inch apart.

Figure 3D:
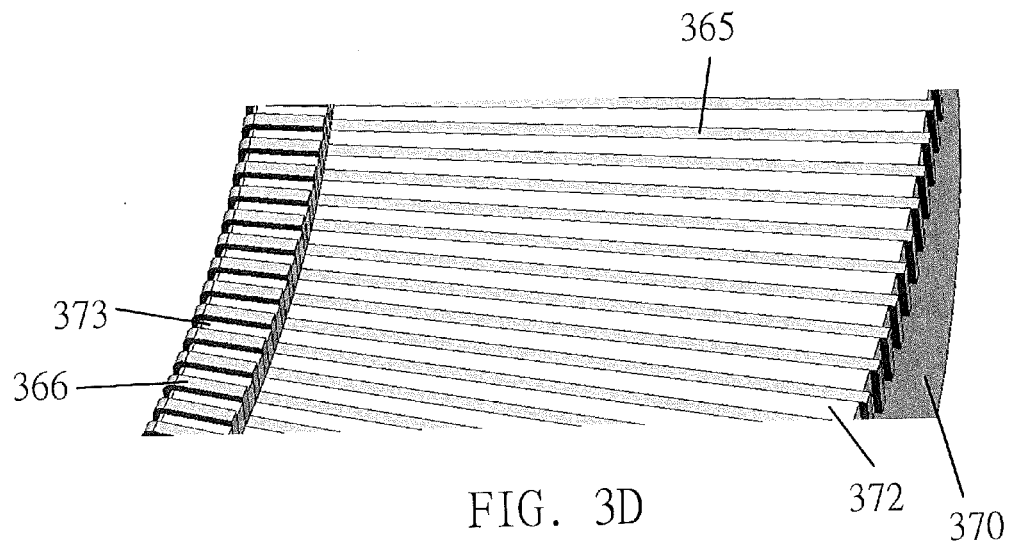

In an embodiment disclosed herein, the silicon containing confinement ring 305 can be formed by inserting silicon containing vanes 365 (see FIG. 3A) into grooves 371 formed in a grooved surface 372 of an annular carbon template 370 having an inner diameter of about 12 inches or larger (see FIG. 3D). Each silicon containing vane 365 is preferably formed from silicon carbide (SiC) and can be formed from converted SiC, sintered SiC, CVD SiC, PECVD SiC, or a cold sprayed SiC, and preferably includes a projection 366 at an end thereof. In a preferred embodiment, each silicon containing vane 365 is formed by machining a flat plate of SiC into a desired form wherein the flat plate of SiC is formed by depositing SiC during a CVD or PECVD process on a graphite mandrel. More preferably each silicon containing vane 365 is formed by cutting the flat plate of SiC into a desired form by electrical discharge machining. Alternatively, each vane can be formed by depositing SiC onto a pre-shaped piece of graphite. In an alternate embodiment, each silicon containing vane 365 can be formed of silicon. As illustrated in FIG. 3A, each silicon containing vane 365 is preferably L-shaped (i.e. has a projection 366 at an end thereof).

In an embodiment about 150 to 1000 silicon containing vanes 365 are inserted into respective grooves 371 of the grooved surface 372 of the annular carbon template 370. Preferably, the silicon containing vanes 365 are configured to maximize the open space formed by slots 226 in the finished silicon containing confinement ring 305 (see FIGS. 3L and 3M), such that gas flow can be maximized when neutral gas species are exhausted therethrough. In an embodiment about 300 silicon containing vanes 365 are inserted into the respective grooves wherein each silicon containing vane 365 can have an end to end length of about 1.5 to 4.5 inches, such as an end to end length of about 2.25 inches, 2.5 inches, 2.75 inches, 3.0 inches, 3.25 inches, 3.5 inches, 3.75 inches, 4.15 inches, or 4.25 inches, a height of about 0.1 to about 2 inches, such as a height of about 0.15 inch, 0.25 inch, 0.75 inch, 1.15 inches, 1.5 inches or about 1.75 inches wherein the projection 366 at the end of the silicon containing vane 365 extends (projects) about 0.17 inch or more beyond the height (upper surface) of each silicon containing vane 365. Each silicon containing vane 365 preferably has a thickness of about 0.08 inch or less, such as a thickness of about 0.06 inch. Preferably, the silicon containing vanes 365 are evenly spaced at radial positions in the annular carbon template 370 wherein the silicon containing vanes 365 are offset by about 2° or less, such as about 1.25° or less, 1° or less, or 0.5° or less. In a preferred embodiment, one or more corners of each silicon containing vane 365 can be rounded.

Figure 3E:
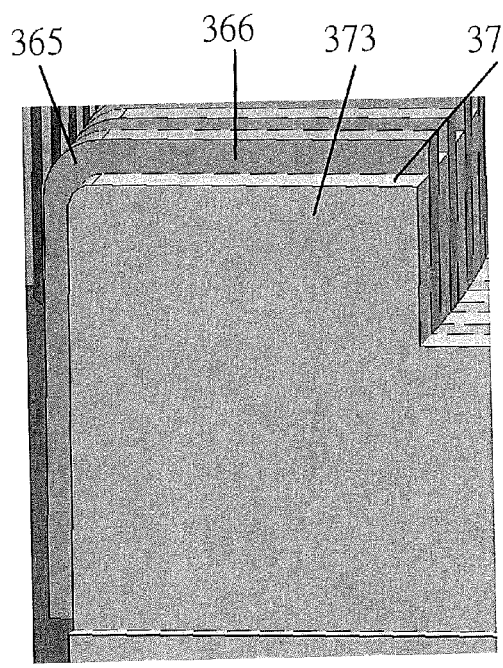
Figure 3F:
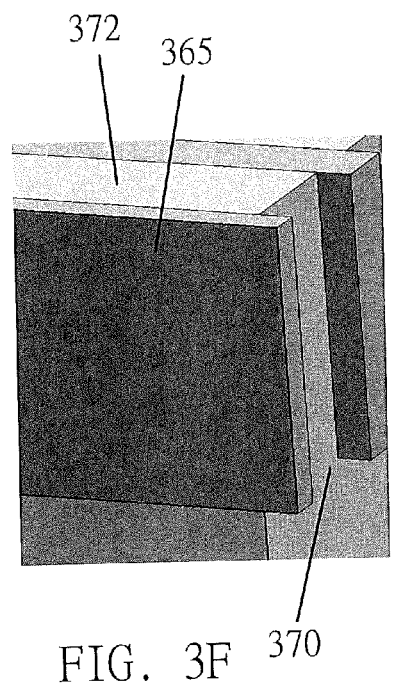

As illustrated in FIGS. 3B and 3C, the grooves 371 are formed in the grooved surface 372 of the annular carbon template 370 wherein the grooved surface 372 includes an upwardly projecting step 373 at an inner perimeter (inner portion) thereof such that each groove 371 is also L-shaped. Each groove 371 extends from the inner perimeter to an outer perimeter of the grooved surface 372. Each silicon containing vane 365 in each respective groove 371 preferably has an upper surface which is flush with an outer portion surrounding the upwardly projecting step 373 of the grooved surface 372 wherein each projection 366 at the end of each silicon containing vane 365 preferably projects above the upper surface of the upwardly projecting step 373 at the inner perimeter of the grooved surface 372 of the annular carbon template 370. In other words, each L-shaped silicon containing vane fits into a respective L-shaped groove 371 such that each projection 366 at the end of each silicon containing vane 365 projects above an upper surface of the upwardly projecting step 373. Further, as illustrated in FIGS. 3D-3F, each end of each silicon containing vane 365 when inserted into a respective groove 371 preferably protrudes beyond the respective inner perimeter and outer perimeter of the annular carbon template 370. In this manner, a portion of each silicon containing vane 365 at each end thereof and a portion of the projection 366 can protrude beyond outer surfaces of the template during a subsequent silicon containing material deposition step as explained below. Preferably each protruding portion of each silicon containing vane 365 protrudes about 0.03 inch or more beyond the surface of the annular carbon template 370. The annular carbon template 370 is preferably formed from a machined piece of graphite.

Figure 3G:
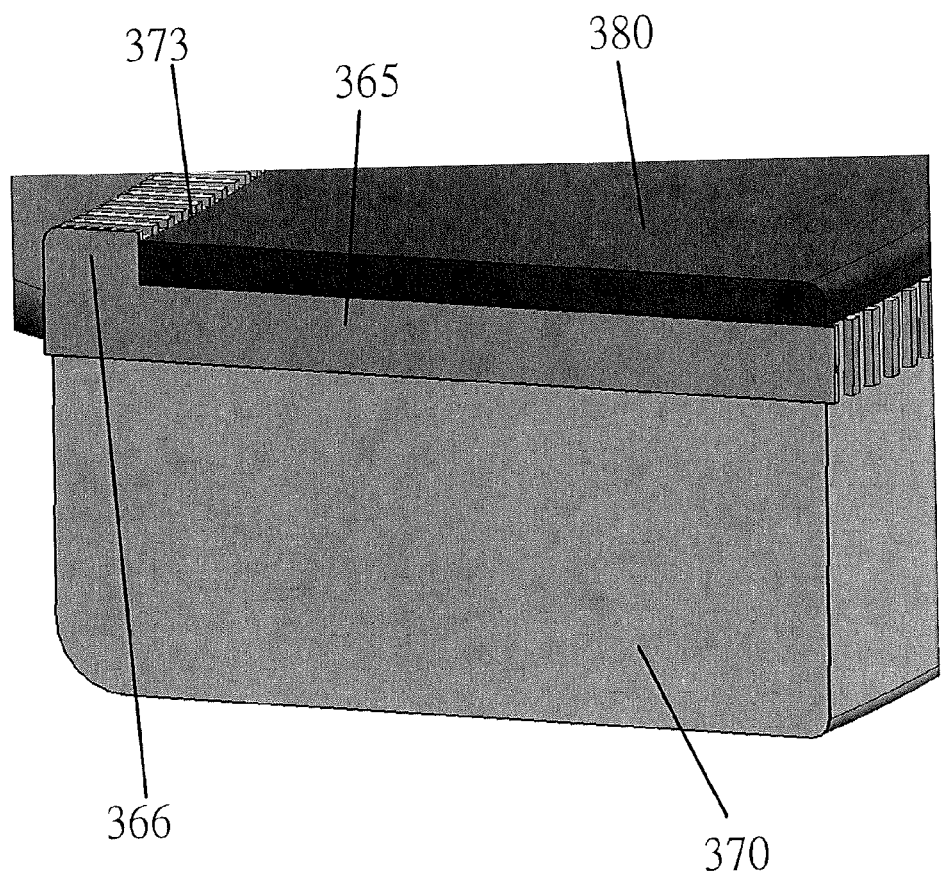
Figure 3H:
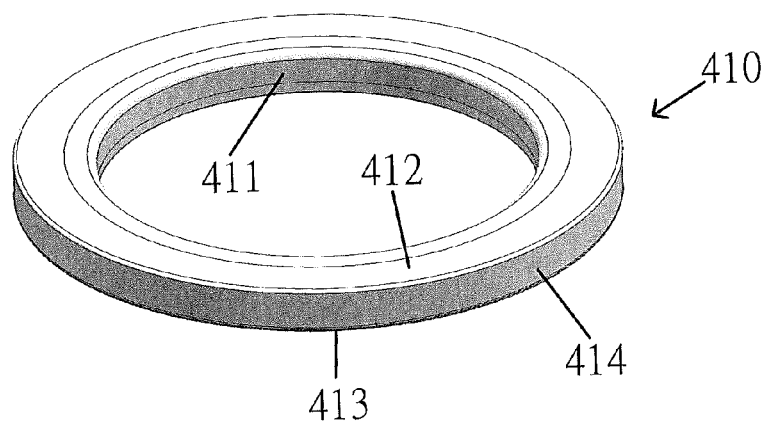
Figure 3I:
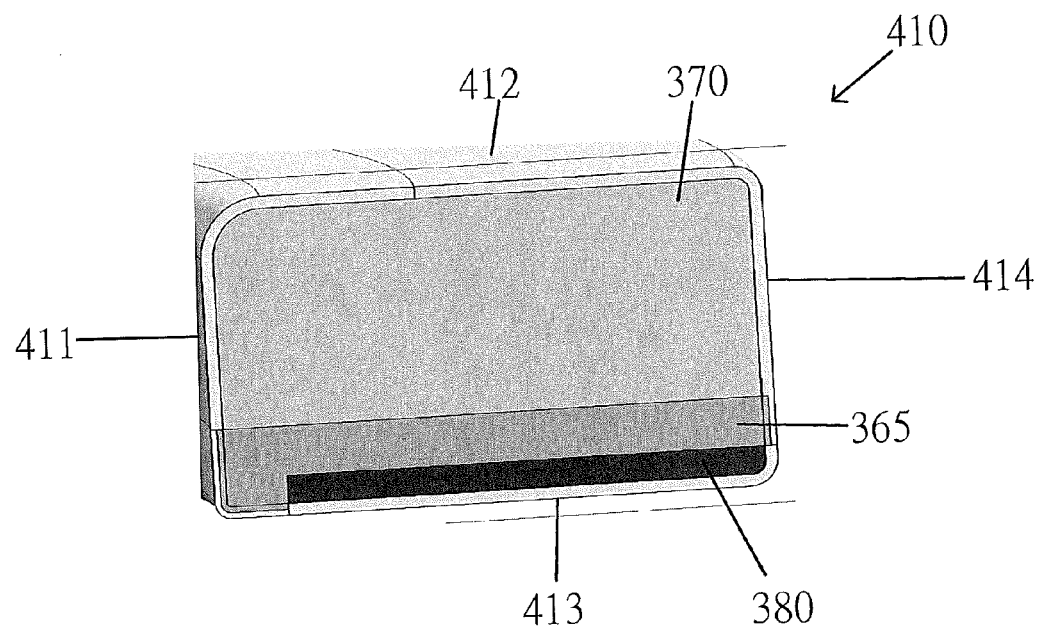

After each silicon containing vane 365 is inserted in a respective groove 371 of the annular carbon template 370, the annular projection 373 of the annular carbon template 370 and the projections 366 of each inserted silicon containing vane 365 are surrounded with an annular carbon member 380 wherein an inner surface of the annular carbon member 380 covers the outer surface of each projection 366 of each vane 365 and a lower surface of the annular carbon member 380 covers the upper surface of each silicon containing vane 365 in each respective groove 371 wherein the upper surface of each silicon containing vane 365 is preferably flush with the upper surface an outer portion of the grooved surface 372 which surrounds the upwardly projecting step 373 (see FIG. 3G). The annular carbon template 370 or the annular carbon member 380 may then be supported in a CVD chamber or PECVD chamber by support pins (not shown) and silicon containing material such as silicon or silicon carbide may be deposited on the annular carbon template 370, the annular carbon member 380, and exposed (protruding) portions of each silicon containing vane 365, thereby forming a silicon containing shell 410 of a predetermined thickness around the annular carbon template 370 and annular carbon member 380 wherein the deposited silicon containing material becomes integral with the exposed (protruding) portions of each silicon containing vane 365. The support pins are preferably configured to support the annular carbon template 370 or the annular carbon member 380 at a region of the annular carbon template 370 or the annular carbon member 380 which corresponds to a portion of the silicon containing shell 410 which is to later be removed, as discussed below, to form the silicon containing confinement ring 305. As illustrated in FIGS. 3H and 3I, the formed silicon containing shell 410 is preferably a ring which has an inner wall 411, an upper wall 412, a lower wall 413, and an outer wall 414, wherein the silicon containing shell 410 surrounds the annular carbon template 370 and the annular carbon member 380, as well as the silicon containing vanes 365 which have become integral with the silicon containing shell 410. In a preferred embodiment, the silicon containing shell 410 forms a conformal coating which surrounds the annular carbon template 370 and the annular carbon member 380, as well as the silicon containing vanes 365, wherein the silicon containing shell 410 preferably has a thickness of about 0.03 to 0.09 inch, and more preferably a thickness of about 0.06 inch.

Figure 3J:
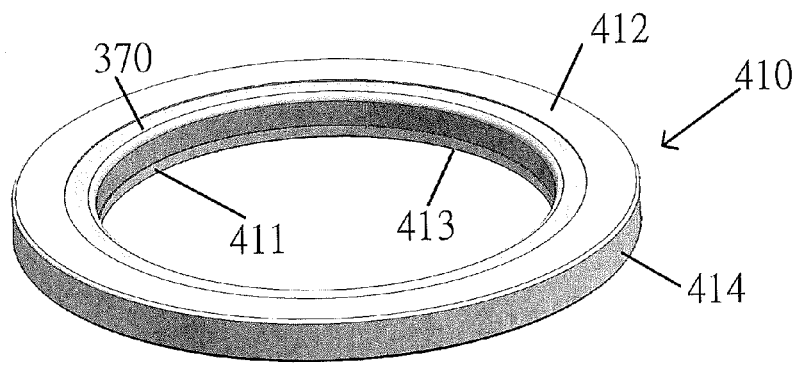
Figure 3K:
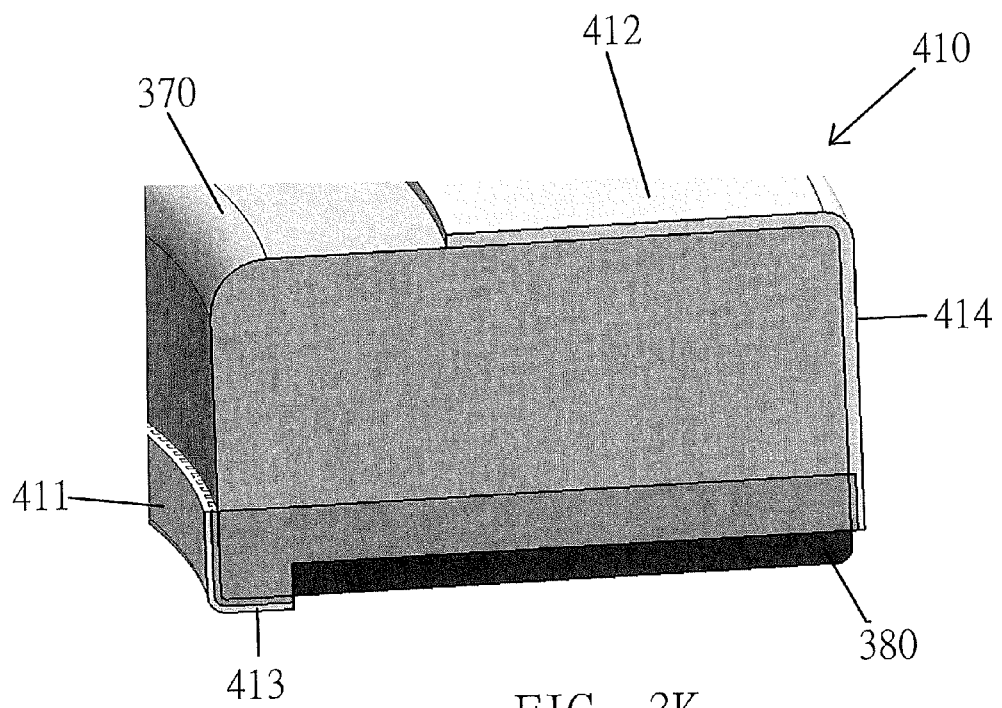
Figure 3L:
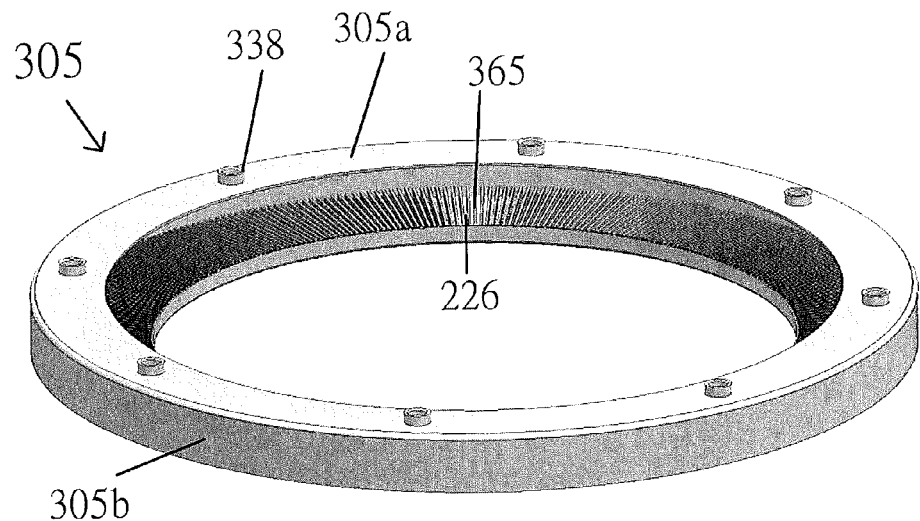
Figure 3M:
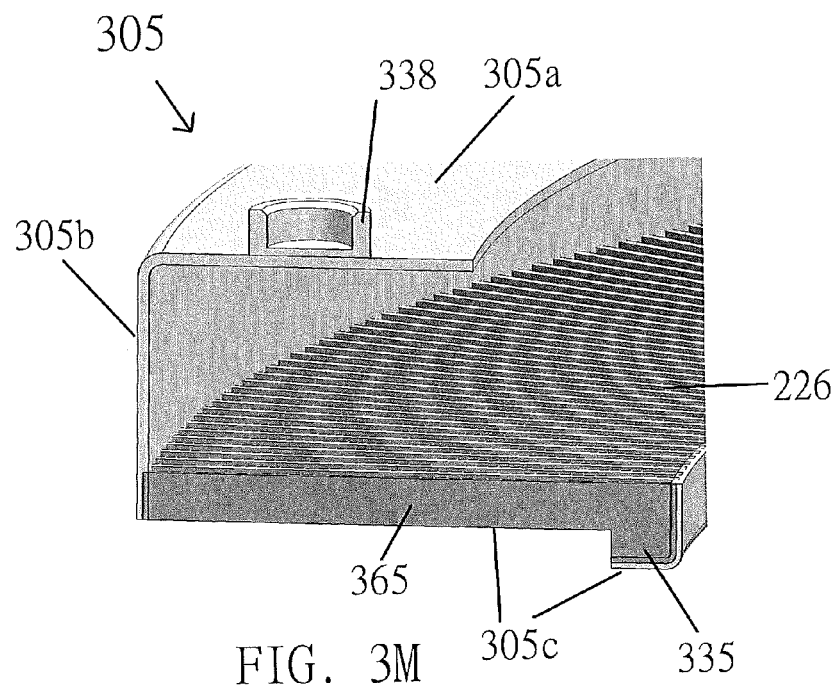

After the silicon containing shell 410 of a predetermined thickness has been formed around the annular carbon template 370, the annular carbon member 380, and the silicon containing vanes 365, portions of the silicon containing shell 410 are removed, thereby exposing portions of the underlying carbon template 370 and annular carbon member 380. For example, in a preferred embodiment as illustrated in FIGS. 3J and 3K, an inner portion of the upper wall 412 and an upper portion of the inner wall 411 of the silicon containing shell 410 are removed, thereby exposing the annular carbon template 370, and an outer portion of the lower wall 413 and a lower portion of the outer wall 414 of the silicon containing shell 410 are removed thereby exposing a portion of the annular carbon member 380. The portions of the silicon containing shell 410 to be removed can be removed by machining the silicon containing shell 410. Preferably, the portions of the silicon containing shell 410 to be removed are sawed off with a slitting saw.

After the portions of the silicon containing shell 410 have been removed, the annular carbon template 370 and the annular carbon member 380 are removed from the silicon containing shell 410. The annular carbon template 370 and annular carbon member 380 can be physically removed, or portions of the annular carbon template 370 and the annular carbon member 380 can be removed from the silicon containing shell 410 by a machining process as discussed below. Alternatively, the annular carbon template 370 and annular carbon member 380, or portions of the annular carbon template 370 and annular carbon member 380 that remain after physical removal thereof, can be removed from the interior of the silicon containing shell 410 by dissociating carbon atoms, contained in the annular carbon template 370 and annular carbon member 380 with a gas that reacts with carbon. In a preferred embodiment, portions of the annular carbon template 370 and annular carbon member 380 are removed in a machining process, and the remainder of the annular carbon template 370 and annular carbon member 380 can be removed by dissociating the carbon atoms therein with a gas that reacts with carbon.

The machining process can be performed by any suitable technique such as grinding, lapping, honing, sawing (i.e. a slitting saw), ultrasonic machining, water jet or abrasive jet machining, electrical discharge machining, ion-beam machining, electron-beam machining, chemical machining, electrochemical machining, or the like. In a preferred embodiment of the method of forming the silicon containing confinement ring 305, the outer surface of the silicon containing confinement ring 305 can be machined, such as by grinding and/or polishing, to achieve a desired surface finish prior to and/or after the removal of the annular carbon template 370 and the annular carbon member 380. Preferably, after the silicon containing confinement ring 305 has been machined to a final form, each wall of the silicon containing confinement ring 305 will have a thickness of about 0.03 to 0.09 inch, such as a thickness of about 0.06 inch.

In an embodiment, the removal process, which includes dissociating the carbon atoms of the annular carbon template 370 and annular carbon member 380, comprises reacting the annular carbon template 370 and annular carbon member 380 with a gas such that the carbon atoms of the annular carbon template 370 and annular carbon member 380 oxidize and may thereby be removed from the silicon containing shell 410 thereby forming the silicon containing confinement ring 305. After the annular carbon template 370 and annular carbon member 380 have been removed from the silicon containing shell 410, the silicon containing confinement ring 305 will remain. As illustrated in FIGS. 3L and 3M, the silicon containing confinement ring 305 will preferably have a C-shaped cross section and the lower annular wall 305c will include radially extending slots 226 through which process gas and reaction byproducts can be pumped out of the plasma processing chamber 300 during plasma processing, wherein the radially extending slots 226 of the silicon containing confinement ring 305 are defined by the silicon containing vanes 365 supported by the silicon containing shell 410.

In an embodiment, the annular carbon template 370 and annular carbon member 380 are each preferably formed from graphite. The annular carbon template 370 and annular carbon member 380 can be removed by heating the silicon containing shell 410 which has exposed graphite (carbon) surfaces in any suitable vessel, such as a high-temperature oven or furnace. The vessel preferably has an oxygen-containing atmosphere which can include, but is not limited to, $O_2$, air, water vapor, or a mixture thereof. In a preferred embodiment, the vessel is sealed and the oxygen-containing atmosphere, such as air, is supplied into the vessel via a gas supply system. The silicon containing shell 410 may be maintained at atmospheric pressure within the vessel, or alternatively the pressure within the vessel may be lowered to sub-atmospheric pressures, during the removal process.

As a result of heating the silicon containing shell 410 with portions of each the annular carbon template 370 and annular carbon member 380 exposed to atmosphere in the presence of oxygen, the annular carbon template 370 and annular carbon member 380 may be chemically removed from the silicon containing shell 410 by converting the carbon to carbon dioxide ($CO_2$) gas and/or carbon monoxide (CO) gas. In essence, the oxygen reacts with the carbon in a combustion reaction that causes the carbon to burn. In an alternate embodiment, the silicon containing shell 410 which includes the annular carbon template 370 and annular carbon member 380 with exposed portions may be heated in the presence of hydrogen, wherein the annular carbon template 370 and annular carbon member 380 may be converted to methane ($CH_4$) gas. Hence the annular carbon template 370 and annular carbon member 380 may be converted from solid to gas, and thereby be evacuated from the interior region of the silicon containing shell 410 thus leaving the silicon containing confinement ring 305.

The oxygen-containing atmosphere is preferably maintained at a temperature that is effective to oxidize the carbon atoms of the annular carbon template 370 and annular carbon member 380 (i.e., convert the carbon member to CO, $CO_2$, or mixtures thereof), but is sufficiently low to substantially avoid oxidizing any SiC included in the silicon containing shell 410, (i.e., adversely affecting mechanical and/or physical properties of the silicon containing shell). Preferably, the temperature of the oxygen-containing atmosphere in the treatment vessel is from about 600° C. to about 1200° C., and more preferably from about 800° C. to about 900° C. The silicon containing shell 410 is preferably treated in the oxygen-containing atmosphere for an amount of time that is effective to remove all or at least substantially all of the carbon from the interior region thereof, preferably from about 2 hours to about 12 hours.

Another preferred method of removing the annular carbon template 370 and annular carbon member 380, such as those formed from graphite, from the interior region of the silicon containing shell 410 includes treating the annular carbon template 370 and annular carbon member 380 with an oxygen plasma to remove all or substantially all of the carbon from the interior region. For example, the silicon containing shell 410 can be treated in an ashing chamber of a semiconductor substrate processing apparatus to remove the annular carbon template 370 and annular carbon member 380. The temperature of the silicon containing shell 410 which includes the annular carbon template 370 and annular carbon member 380 can range, for example, from about 200° C. to about 300° C. during the removal step. In some embodiments, the plasma aching process may be performed at sub-atmospheric pressures. In some embodiments, the pressure may be about 100 mbar or less.

Referring to FIGS. 3L and 3M, after the annular carbon template 370 and annular carbon member 380 have been removed, the silicon containing confinement ring 305 will remain. Preferably, after the silicon containing confinement ring 305 is formed, the outer surfaces thereof will undergo a finishing grind and oxidation cleaning. Bosses 338 are then brazed or bonded to the upper annular wall 305a. Preferably the bosses are internally threaded which have a major diameter of about 7/16 inch and about 28 threads per inch. Alternatively, the bosses 338 can be brazed or bonded to the silicon containing confinement ring prior to a surface cleaning process.

The silicon containing confinement ring 305 is useful as a component of a capacitively-coupled plasma processing chamber wherein inner surfaces of the silicon containing confinement ring 305 provide an extended plasma confinement zone surrounding a gap between an upper electrode and a lower electrode on which a semiconductor substrate is supported during plasma processing in the chamber.

While the silicon containing confinement ring and methods of forming the silicon containing confinement ring have been described in detail with reference to specific embodiments thereof, it will be apparent to those skilled in the art that various changes and modifications can be made, and equivalents employed, without departing from the scope of the appended claims.

What is claimed is:

1. A method of forming a silicon containing confinement ring for a plasma processing apparatus useful for processing a semiconductor substrate, the method comprising:
   inserting silicon containing vanes into grooves formed in a grooved surface of an annular carbon template wherein the grooved surface of the annular carbon template includes an upwardly projecting step at an inner perimeter thereof wherein each groove extends from the inner perimeter to an outer perimeter of the grooved surface;
   surrounding the step of the grooved surface with an annular carbon member wherein the annular carbon member covers an upper surface of each silicon containing vane in each respective groove;
   depositing silicon containing material on the annular carbon template, the annular carbon member, and exposed portions of each silicon containing vane thereby forming a silicon containing shell of a predetermined thickness;
   removing a portion of the silicon containing shell; and
   removing the annular carbon template and the annular carbon member from the silicon containing shell leaving a silicon containing confinement ring wherein the silicon containing vanes are supported by the silicon containing shell of the silicon containing confinement ring.

2. The method of claim 1, further comprising machining graphite to form the annular carbon template with an inner diameter of at least about 12 inches and the annular carbon member with an inner diameter larger than the inner diameter of the annular carbon template.

3. The method of claim 1, wherein depositing silicon containing material on the annular carbon template, annular carbon member, and exposed portions of the silicon containing vanes includes supporting the annular carbon template or the annular carbon member at a region which underlies a portion of the silicon containing shell which is removed to form the silicon containing confinement ring.

4. The method of claim 1, wherein the silicon containing material is deposited on the annular carbon template, the annular carbon member, and exposed portions of each silicon containing vane by chemical vapor deposition, or plasma enhanced chemical vapor deposition.

5. The method of claim 1, further comprising
   (a) performing an oxidation process on the silicon containing confinement ring to clean the outer surfaces thereof; and/or
   (b) finishing grinding the silicon containing confinement ring to final dimensions.

6. The method of claim 1, and forming the silicon containing vanes by electrical discharge machining a flat plate of CVD silicon containing material to form vanes with a length of about 1.5 to 4.5 inches, a height of about 0.1 to 2 inches, a thickness of about 0.08 inch or less, wherein each silicon containing vane includes a projection at an end thereof extending at least about 0.17 inch or more from an upper surface thereof.

7. The method of claim 1, wherein the annular carbon template and the annular carbon member are removed from the silicon containing shell by heating the silicon containing shell which contains the annular carbon template and the annular carbon member to 600° C. or greater in an oxygen-containing atmosphere to remove the carbon from the interior region of the silicon containing shell thereby leaving the silicon containing confinement ring.

8. The method of claim 1, further comprising attaching internally threaded bosses to an upper surface of the silicon containing confinement ring.

9. The method of claim 1, further comprising coating a lower surface of the silicon containing confinement ring with an electrically conductive coating adapted to enhance electrical contact with an adjacent component when installed in the plasma processing apparatus.

10. The method of claim 1, wherein the silicon containing material depositing step forms the silicon containing shell to a thickness of about 0.03 to about 0.09 inch.

11. The method of claim 1, wherein
   (a) about 150 to 1000 silicon containing vanes are inserted into corresponding grooves of the annular carbon template;
   (b) the exposed portions of each silicon containing vane include a portion at each end of the silicon containing vane which protrudes beyond the respective inner and outer perimeters of the grooved surface of the annular carbon template and a portion of the projection of the silicon containing vane which protrudes beyond an upper surface of the upwardly projecting step of the grooved surface of the annular carbon template;
   (c) each exposed portion of each silicon containing vane in the annular carbon template protrude beyond each respective groove of the annular carbon template by about 0.03 inch or more; and/or
   (d) the upper surface of each silicon containing vane is flush with an upper surface of an outer portion of the grooved surface of the annular carbon template which surrounds the upwardly projecting step thereof.

12. The method of claim 1, wherein the annular carbon template and the annular carbon member are removed from the interior region of the silicon containing shell by reacting the annular carbon template and annular carbon member with a gas that reacts with carbon, thereby dissociating the annular carbon template and annular carbon member.

13. The method of claim 1, wherein the annular carbon template and the annular carbon member are removed from the interior region of the silicon containing shell by machining and physically removing the annular carbon template and annular carbon member.

14. The method of claim 13, wherein portions of the annular carbon template and the annular carbon member are removed from the interior region of the silicon containing shell by machining and remaining portions of the annular carbon template and/or the annular carbon member are removed by reacting the remaining portions with a gas that reacts with carbon, thereby dissociating the remaining portions.

* * * * *